United States Patent
Nagata et al.

(10) Patent No.: US 7,652,503 B2
(45) Date of Patent: Jan. 26, 2010

(54) SEMICONDUCTOR DEVICE (75) Inventors: Hidenari Nagata, Kawasaki (JP);
Masanori Ishizuka, Kawasaki (JP);
Tatsushi Otsuka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 400 days.

(21) Appl. No.: 11/644,827

(22) Filed: Dec. 26, 2006

(65) Prior Publication Data
US 2008/0122485 A1 May 29, 2008

(30) Foreign Application Priority Data
Aug. 18, 2006 (JP) ............................. 2006-223500

(51) Int. Cl.
*H03K 19/0175* (2006.01)
*G06F 9/06* (2006.01)

(52) U.S. Cl. ........................................ 326/62; 327/407
(58) Field of Classification Search .................. 326/62; 327/407; 710/52–54
See application file for complete search history.

(56) References Cited

U.S. PATENT DOCUMENTS
6,073,190 A * 6/2000 Rooney ....................... 710/56

FOREIGN PATENT DOCUMENTS
JP 60-31641 A 2/1985
JP 7-6154 A 1/1995

* cited by examiner

*Primary Examiner*—Daniel D Chang
(74) *Attorney, Agent, or Firm*—Arent Fox LLP (57) ABSTRACT

A semiconductor device includes an external pin, a control parameter decision circuit, and a register update circuit. The control parameter decision circuit includes a register and an output selector. The register is initialized in accordance with resetting of the semiconductor device. The output selector, according to a level value of an external input signal supplied via the external pin, selects one of a signal whose level value is set equal to a register value of the register and a signal whose level value is set opposite to the register value of the register, and outputs the selected signal as a control parameter signal. The register update circuit updates the register value of the register when a level value of the control parameter signal need be changed.

8 Claims, 7 Drawing Sheets

Prior Art

Fig. 1A

Prior Art

Fig. 1B

Prior Art

Fig. 2A

Prior Art

SEMICONDUCTOR DEVICE

CROSS REFERENCE TO RELATED APPLICATION

This application is based upon and claims the benefit of priority from Japanese Patent application No. 2006-223500, filed on Aug. 18, 2006, the entire contents of which are incorporated herein by reference.

BACKGROUND OF THE INVENTION

1. Field of the Invention

The present invention relates to a semiconductor device, and more particularly, to a semiconductor device whose internal state is set in accordance with a type of an external device via an external pin.

2. Description of the Related Art

A semiconductor device to which a plurality of types of external devices are connectable is provided with an internal circuit (external interface circuit) which controls the external devices. In order to set an operation mode of the internal circuit in accordance with the type of the external devices, the following signal transmitting methods and the like are adopted: one method is that a selector selects a desired control parameter signal from a plurality of control parameter signals according to a level value of an external input signal and transmits the selected control parameter signal to the internal circuit; and another method is that according to a level value of an external input signal, a CPU writes a data signal to a control parameter setting register, which then transmits a desired control parameter signal to the internal circuit.

Figure 1A:
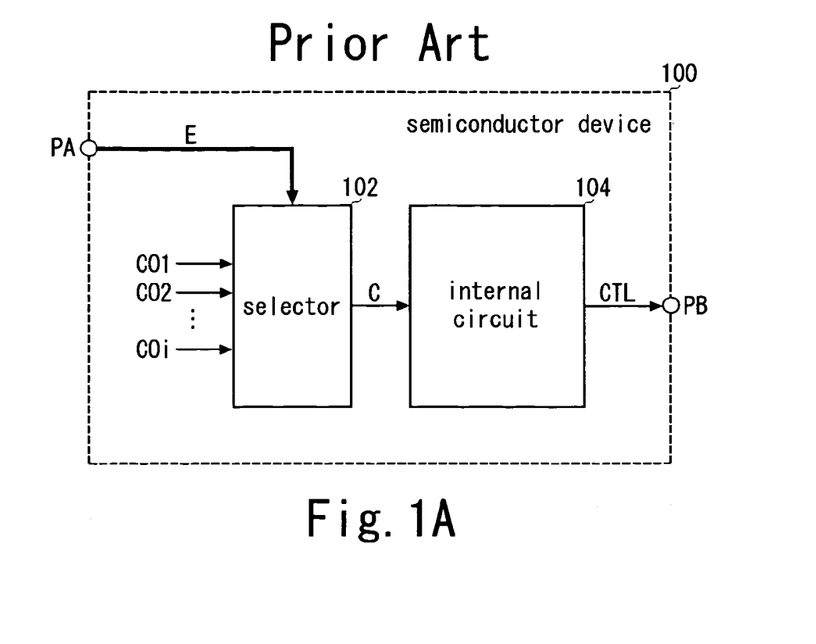
FIG. 1A and FIG. 1B are explanatory diagram and chart showing a conventional semiconductor device (first conventional example)
Figure 1B:
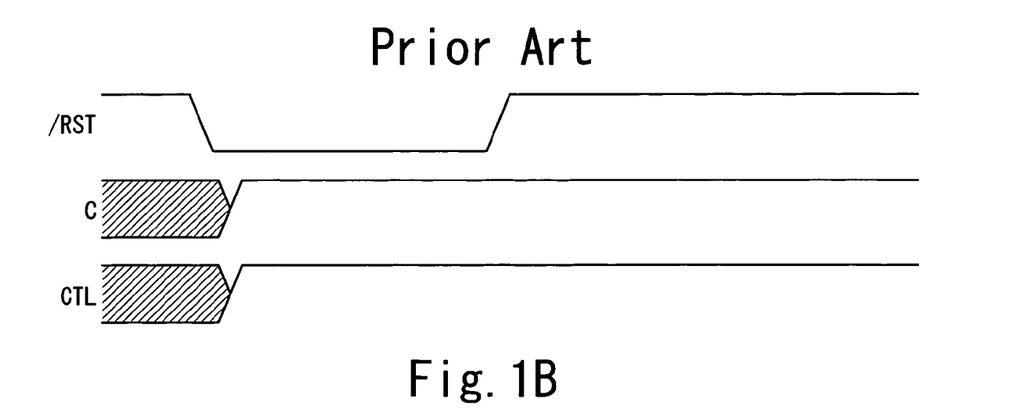

FIG. 1A and FIG. 1B show a conventional semiconductor device (a first conventional example). FIG. 1A shows the structure of a semiconductor device of the first conventional example. In a semiconductor device 100 of the first conventional example, a selector 102 selects one of control parameter signals CO1~COi according to a level value of each of a plurality of external input signals E that are supplied thereto via a plurality of external pins PA, and outputs the selected signal as a control parameter signal C. For example, in response to the activation of a reset signal /RST (not shown), level values of the control parameter signals CO1~COi are set to level values determined for the respective control parameter signals CO1~Coi in advance. Incidentally, the reset signal /RST is a signal that is activated when the semiconductor device 100 is reset. An internal circuit 104 executes an operation of outputting an external control signal CTL via an external pin PB according to a level value of the control parameter signal C supplied thereto from the selector 102. For example, the internal circuit 104 handles the external control signal CTL as a positive logic signal when the level value of the control parameter signal C is "0", whereas it handles the external control signal CTL as a negative logic signal when the level value of the control parameter signal C is "1".

FIG. 1B shows the operation in the semiconductor device in FIG. 1A when it is reset. It is assumed here that the level value of the control parameter signal CO1 is set to "1" in response to the activation of the reset signal /RST. It is also assumed that an external device externally attached to the semiconductor device 100 is of a type that handles the external control signal CTL as a negative logic signal. Accordingly, it is assumed that the level value of the external input signal E has been set to a level value based on which the selector 102 selects the control parameter signal CO1. In such a case, when a level value of the reset signal /RST changes from "1" to "0" (when the reset signal /RST is activated), the level value of the control parameter signal CO1 is initialized to "1", and since the control parameter signal CO1 has been selected by the selector 102, the level value of the control parameter signal C is initialized to "1". Consequently, from an instant immediately after the semiconductor device 100 is reset, the internal circuit 104 handles the external control signal CTL as the negative logic signal to set a level value of the external control signal CTL to "1".

Figure 2A:
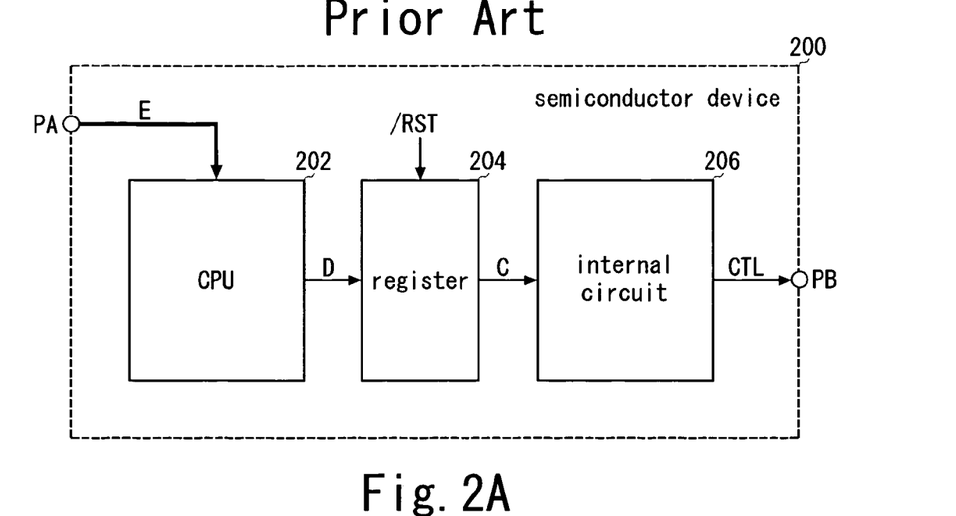
FIG. 2A and FIG. 2B are explanatory diagram and chart showing a conventional semiconductor device (second conventional example)
Figure 2B:
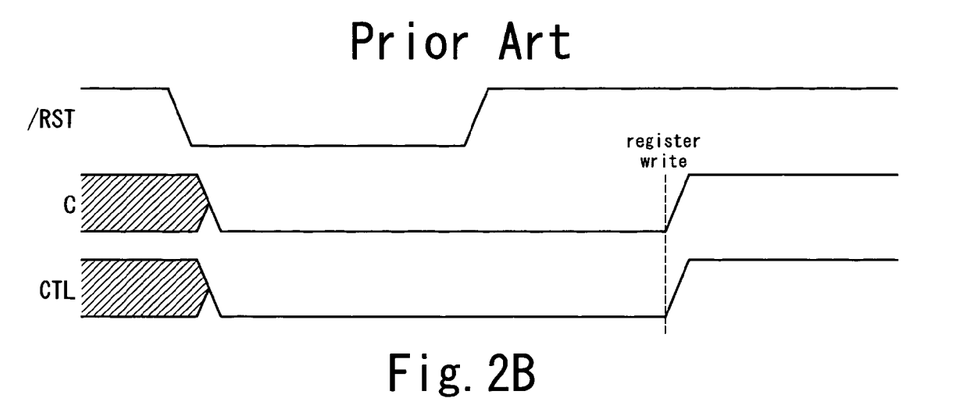

FIG. 2A and FIG. 2B show a conventional semiconductor device (second conventional example). FIG. 2A shows the structure of the semiconductor device of the second conventional example. In a semiconductor device 200 of the second conventional example, after the semiconductor 200 is reset, a CPU 202 writes a data signal D to a register 204 according to a level value of each of a plurality of external input signals E supplied thereto via a plurality of external pins PA. The register 204 constantly sets a level value of a control parameter signal C, which is to be supplied to the internal circuit 206, equal to a register value. The register value of the register 204 is initialized to a predetermined value (for example, "0") in response to the activation of a reset signal /RST. Incidentally, the reset signal /RST is a signal that is activated when the semiconductor device 200 is reset. The internal circuit 206 executes an operation of outputting an external control signal CTL via an external pin PB according to the level value of the control parameter signal C supplied thereto from the register 204. For example, similarly to the internal circuit 104 in FIG. 1A, the internal circuit 206 handles the external control signal CTL as a positive logic signal when the level value of the control parameter signal C is "0", whereas it handles the external control signal CTL as a negative logic signal when the level value of the control parameter signal C is "1".

FIG. 2B shows the operation in the semiconductor device in FIG. 2A when it is reset. It is assumed here that an external device externally attached to the semiconductor device 200 is of a type handling the external control signal CTL as the negative logic signal. Accordingly, it is assumed that the level value of the external input signal E has been set to a level value based on which the CPU 202 writes the data signal D ("1") to the register 204. In such a case, when a level value of the reset signal /RST changes from "1" to "0" (when the reset signal /RST is activated), the register value of the register 204 is initialized to "0", so that the level value of the control parameter signal C is initialized to "0". Consequently, immediately after the semiconductor device 200 is reset, the internal circuit 206 handles the external control signal CTL as the positive logic signal and the level value of the external control signal CTL is set to "0". Thereafter, when the CPU 202 writes the data signal D ("1") to the register 204, the level value of the control parameter signal C is changed from "0" to "1". Therefore, from an instant when the CPU 202 writes the data signal D ("1") to the register 204, the internal circuit 206 handles the external control signal CTL as the negative logic signal to set the level value of the external control signal CTL to "1".

Further, Japanese Unexamined Patent Application Publication No. Hei 7-6154 discloses an art to realize an effective use of external pins without reducing the number of general-purpose external pins by making a plurality of operation modes settable in a microcomputer via one external pin dedicated for operation mode setting. Specifically, at a resetting of the microcomputer, a signal inputted from the general-purpose external pin is latched in response to a signal inputted from a reset external pin, and the latched signal and a signal inputted from the external pin dedicated for operation mode setting are decoded, whereby an operation mode setting signal corresponding to a result of the decoding is selected from a plurality of operation mode setting signals. Japanese Unexamined Patent Application Publication No. Sho 60-31641 discloses an art to realize simplification of an external circuit and easy-to-use structure thereof for a user by making switchable a mode designated by a user and a mode set from an exterior via one external pin in a one-chip microcomputer.

In the first conventional example shown in FIG. 1A and FIG. 1B, immediately after the resetting of the semiconductor device 100, the level value of the external input signal E is reflected in the level value of the control parameter signal C, and the internal circuit 104 executes a desired operation (handles the external control signal CTL as the negative logic signal). However, there is a drawback of less versatility since the level value of the control parameter signal C cannot be changed after the semiconductor device 10 is reset.

On the other hand, in the second conventional example shown in FIG. 2A and FIG. 2B, after the semiconductor device 200 is reset, the level value of the control parameter signal C is changeable by the CPU 202 writing the data signal D to the register 204. However, a drawback of this example is that the internal circuit 206 executes an undesired operation (handles the external control signal CTL as the positive logic signal) during a period from the instant immediately after the semiconductor device 200 is reset to a instant when the CPU 202 writes the data signal D to the register 204, since the level value of the external input signal E is not reflected in the level value of the control parameter signal C from the instant immediately after the semiconductor device 200 is reset.

SUMMARY OF THE INVENTION

It is an object of the present invention to prevent an undesirable operation immediately after a semiconductor device is reset and to enable setting information about the control of an external device to be changed after the semiconductor device is reset.

In a first aspect of the present invention, a semiconductor device includes an external pin, a control parameter decision circuit, and a register update circuit. The control parameter decision circuit includes a register and an output selector. The register is initialized in accordance with resetting of the semiconductor device. The output selector, according to a level value of an external input signal supplied via the external pin, selects one of a signal whose level value is set equal to a register value of the register and a signal whose level value is set opposite to the register value of the register, and outputs the selected signal as a control parameter signal. The register update circuit updates the register value of the register when a level value of the control parameter signal need be changed. The semiconductor device further includes, for example, an external interface circuit controlling an external device, to use the control parameter signal for controlling the external interface circuit. Alternatively, the control parameter signal is used for controlling an external device.

Preferably, the register value of the register is set to a level value of a write data signal in response to activation of a write request signal. When the level value of the control parameter signal need be changed, the register update circuit activates the write request signal and sets the level value of the write data signal according to the level value of the control parameter signal and the level value of the external input signal. Alternatively, the control parameter decision circuit further includes an input selector. The input selector selects, for output, one of a write data signal and a signal whose level value is set opposite to a level value of the write data signal, according to the level value of the external input signal. The register value of the register is set to a level value of an output signal of the input selector in response to activation of a write request signal. When the level value of the control parameter signal need be changed, the register update circuit activates the write request signal and sets the level value of the write data signal to a level value opposite to the level value of the control parameter signal.

According to the first aspect as structured above, the level value of the control parameter signal can be set via the external pin immediately after the semiconductor device is reset. Therefore, fixing the level value of the external input signal according to the type of the external device makes it possible to surely prevent an undesired operation immediately after the resetting of the semiconductor device. Further, it is possible to change the level value of the control parameter signal after the semiconductor device is reset, by the register update circuit's updating the register value of the register in the control parameter decision circuit.

According to a second aspect of the present invention, a semiconductor device includes a plurality of external pins, an initial state decision circuit, a control parameter decision circuit, and a register update circuit. The initial state decision circuit sets a level value of an initial state selection signal according to level values of a plurality of external input signals supplied via the plural external pins. The control parameter decision circuit includes a register and an output selector. The register is initialized in accordance with resetting of the semiconductor device. The output selector selects, according to the level value of the initial state selection signal, one of a signal whose level value is set equal to a register value of the register and a signal whose level value is set opposite to the register value of the register, and outputs the selected signal as a control parameter signal. The register update circuit updates the register value of the register when a level value of the control parameter signal need be changed. The semiconductor device further includes, for example, an external interface circuit that controls an external device, to use the control parameter signal for controlling the external interface circuit. Alternatively, the control parameter signal is used for controlling an external device.

Preferably, the register value of the register is set to a level value of a write data signal in response to activation of a write request signal. When the level value of the control parameter signal need be changed, the register update circuit activates the write request signal and sets the level value of the write data signal according to the level value of the control parameter signal and the level value of the initial state selection signal. Alternatively, the control parameter decision circuit further includes an input selector. The input selector selects, for output, one of a write data signal and a signal whose level value is set opposite to a level value of the write data signal, according to the level value of the initial state selection signal. The register value of the register is set to a level value of an output signal of the input selector in response to activation of a write request signal. When the level value of the control parameter signal need be changed, the register update circuit activates the write request signal and sets the level value of the write data signal opposite to the level value of the control parameter signal. The second aspect as structured above can also provide the same effects as those of the above-described first aspect.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 3:
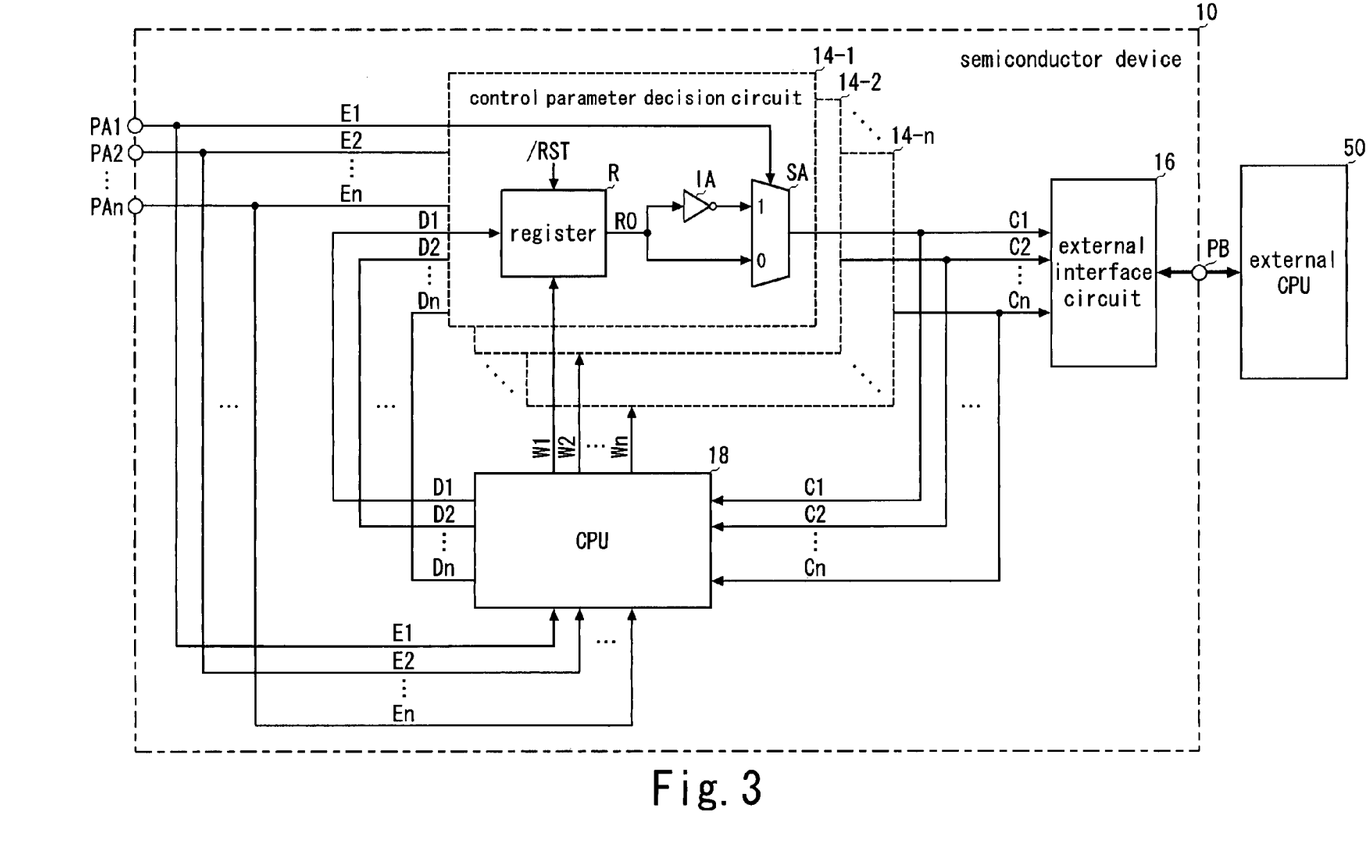
FIG. 3 is a block diagram showing a first embodiment of the present invention.

Hereinafter, embodiments of the present invention will be described by using the drawings. FIG. 3 shows a first embodiment of the present invention. A semiconductor device 10 of the first embodiment includes external pins PA1~PAn, PB, control parameter decision circuits 14-1~14-n, an external interface circuit 16, and a CPU 18.

The control parameter decision circuit 14-$k$ ($k=1, 2, \ldots, n$) includes a register R, an inverter IA, and a selector SA. In the control parameter decision circuit 14-$k$, the register R is provided to change a level value of a control parameter signal Ck and is constituted by using a flipflop or the like. A register value of the register R is set to a level value of a write data signal Dk supplied from the CPU 18, in response to the activation of a write request signal Wk supplied from the CPU 18. Further, the register value of the register R is initialized to a predetermined value (for example, "0") in response to the activation of a reset signal /RST. A level value of an output signal RO of the register R is constantly set equal to the register value of the register R. Incidentally, the reset signal /RST is supplied via a reset external pin (not shown) or the like and is activated when the semiconductor device 10 is reset.

The inverter IA inverts the output signal RO of the register R to output the resultant. The selector SA selects the output signal of the inverter IA (signal whose level value is set opposite to the level value of the output signal RO of the register R) and outputs the selected signal as a control parameter signal Ck when a level value of an external input signal Ek supplied via the external pin PAk is "1", whereas the selector SA selects the output signal RO of the register R and outputs the selected signal as the control parameter signal Ck when the level value of the external input signal Ek is "0".

The external interface circuit 16 controls an external CPU 50 (supplies/receives interface signals to/from the external CPU 50) via the external pin PB, according to the level values of the control parameter signals C1~Cn supplied from the control parameter decision circuits 14-1~14-n. The interface signals exchanged between the semiconductor device 10 (the external interface circuit 16) and the external CPU 50 include generally-known signals such as a chip select signal, a read strobe signal, a write strobe signal, an address signal, an interrupt signal, a ready signal, and a data signal.

For example, the control parameter signal C1 is intended for designating logic of a ready signal RDY that is to be supplied to the external CPU 50 from the semiconductor device 10 (external interface circuit 16). Incidentally, the ready signal RDY is one of the interface signals supplied to the external CPU 50 via the external pin PB. When a level value of the control parameter signal C1 is "0", the external interface circuit 16 executes an operation of outputting the ready signal RDY in a positive logic mode (handles the ready signal RDY as a positive logic signal). On the other hand, when the level value of the control parameter signal C1 is "1", the external interface circuit 16 executes the operation of outputting the ready signal RDY in a negative logic mode (handles the ready signal RDY as a negative logic signal).

Further, the control parameter signal C2 is intended for designating an output state of the ready signal RDY. When a level value of the control parameter signal C2 is "0", the external interface circuit 16 executes the operation of outputting the ready signal RDY in a constant output mode (constantly outputs the ready signal RDY). On the other hand, when the level value of the control parameter signal C2 is "1", the external interface circuit 16 executes the operation of outputting the ready signal RDY in a HiZ switching mode (sets the ready signal RDY to a HiZ state as required).

When a change of the level value of the control parameter signal Ck is required, the CPU 18 activates the write request signal Wi and sets the level value of the write data signal Dk based on the level value of the external input signal Ek and the level value of the control parameter signal Ck. Concretely, when the level value of the control parameter signal Ck needs to be changed from "0" to "1", the CPU 18 sets the level value of the write data signal Dk to "1" if the level value of the external input signal Ek is "0", whereas the CPU 18 sets the level value of the write data signal Dk to "0" if the level value of the external input signal Ek is "1". Further, when the level value of the control parameter signal Ck needs to be changed from "1" to "0", the CPU 18 sets the level value of the write data signal Dk to "0" if the level value of the external input signal Ek is "0", whereas the CPU 18 sets the level value of the write data signal Dk to "1" if the level value of the external input signal Ek is "1".

For example, if there arises a need to change the level value of the control parameter signal Ck from "1" to "0" in a state in which the register value of the register R in the control parameter decision circuit 14-$k$ is "0" and the level value of the external input signal Ek is "1", the CPU 18 activates the write request signal Wk and sets the level value of the write data signal Dk to "1", so that the register value of the register R in the control parameter decision circuit 14-$k$ is changed from "0" to "1" in response to the activation of the write request signal Wk. Consequently, in the control parameter decision circuit 14-$k$, the level value of the output signal RO of the register R is changed from "0" to "1", and as a result, the level value of the output signal of the inverter IA is change from "1" to "0". At this time, in the control parameter decision circuit 14-$k$, since the selector SA has selected the output signal of the inverter IA, the level value of the control parameter signal Ck is changed from "1" to "0".

Figure 4:
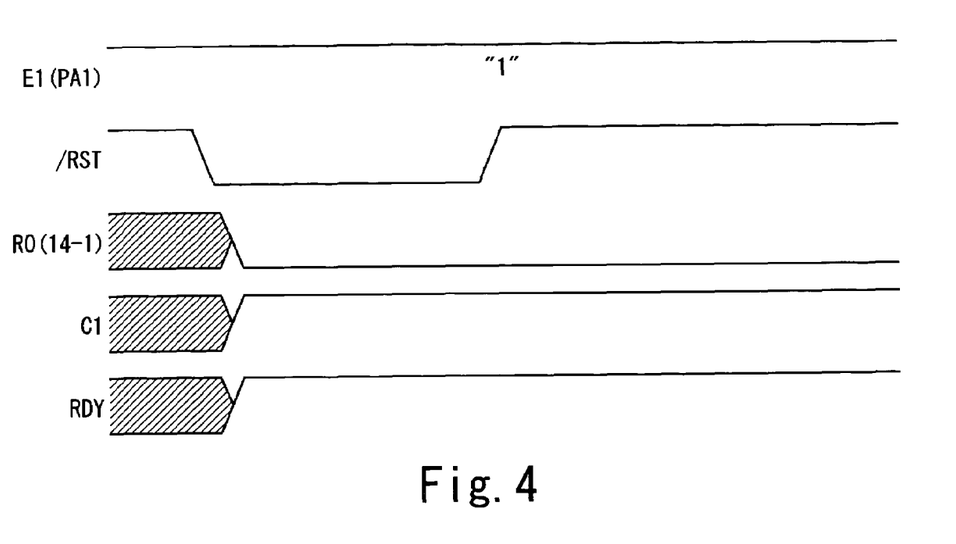
FIG. 4 is a timing chart showing the operation in a semiconductor device in FIG. 3 when it is reset.

FIG. 4 shows the operation in the semiconductor device in FIG. 3 when it is reset. It is assumed here that the external CPU 50 is of a type handling the ready signal RDY as the negative logic signal. Accordingly, it is assumed that the level value of the external input signal E1 has been set to "1" in order to set the level value of the control parameter signal C1 to "1" from an instant immediately after the semiconductor device 10 is reset.

In such a case, when a level value of the reset signal /RST changes from "1" to "0" (when the reset signal /RST is activated), in the control parameter decision circuit 14-1, the level value of the output signal RO of the register R is initialized to "0", but the level value of the control parameter signal C1 is initialized to "1" since the selector SA has selected the output signal of the inverter IA. Therefore, the external interface circuit 16 executes the operation of outputting the ready signal RDY in the negative logic mode from an instant immediately after the semiconductor device 10 is reset. Therefore, the level value of the ready signal RDY is set to "1" from the instant immediately after the semiconductor device 10 is reset.

In the first embodiment as structured above, it is possible to set the level values of the control parameter signals C1~Cn via the external pins PA1~PAn immediately after the resetting of the semiconductor device. Therefore, by fixing the level values of the external input signals E1~En according to the type (interface specification and the like) of the external CPU 50, an undesired operation immediately after the resetting of the semiconductor device 10 can be surely prevented. Further, the change of the level values of the control parameter signals C1~Cn after the resetting of the semiconductor device 10 is enabled by the CPU 18 updating the register value of the register R in the control parameter decision circuits 14-1~14-n.

Figure 5:
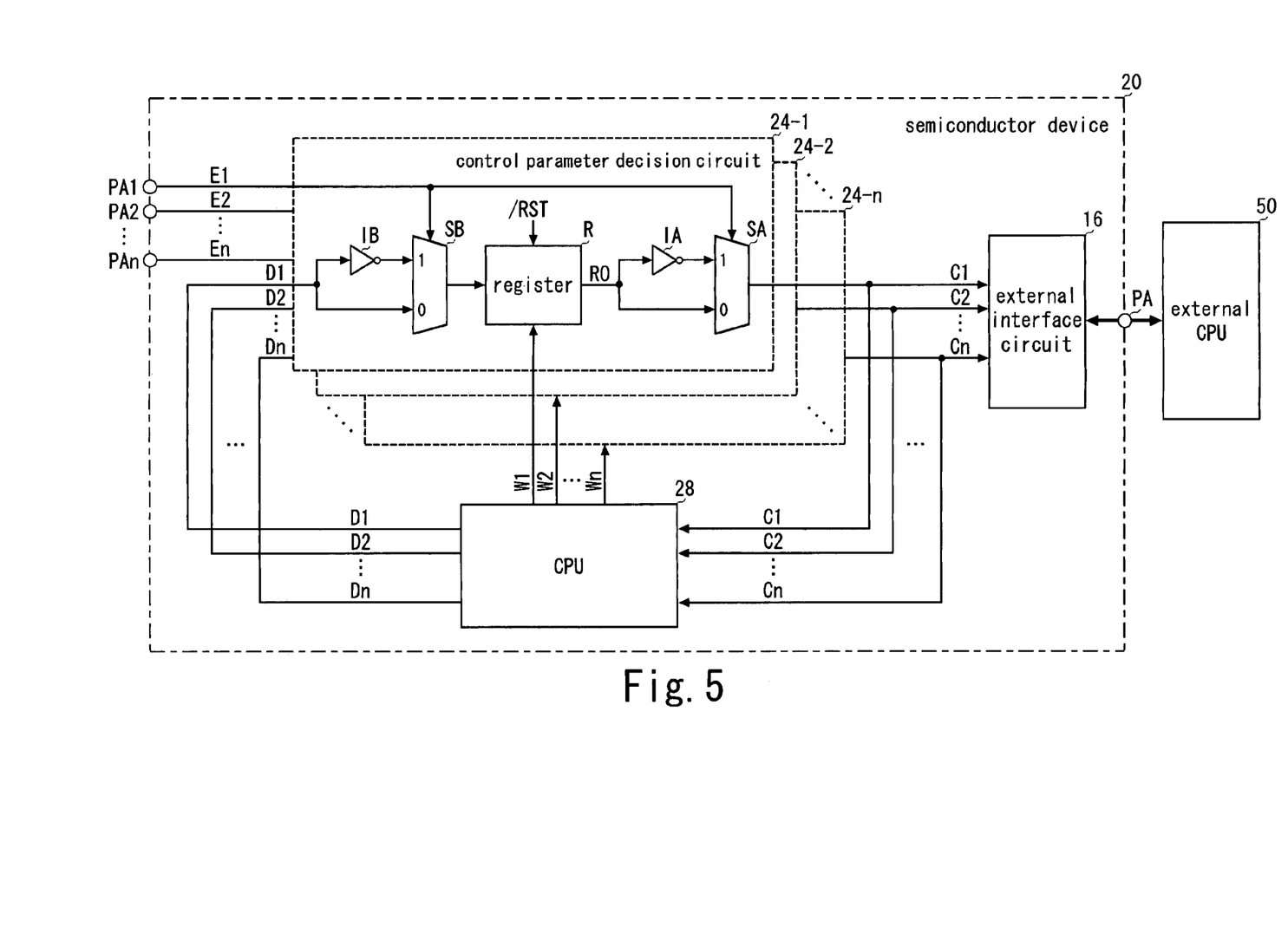
FIG. 5 is a block diagram showing a second embodiment of the present invention.

FIG. 5 shows a second embodiment of the present invention. In the description of second embodiment (FIG. 5) below, the same reference numerals and symbols are used to designate the same elements as the elements described in the first embodiment (FIG. 3) and detailed description thereof will be omitted. A semiconductor device 20 of the second embodiment is structured such that the control parameter decision circuits 14-1~14-n and the CPU 18 in the semiconductor device 10 of the first embodiment are replaced by control parameter decision circuits 24-1~24-n and the CPU 28.

The control parameter decision circuit 24-k (k=1, 2, ..., n) is structured such that an inverter IB and a selector SB are additionally provided in the control parameter decision circuit 14-k. In the control parameter decision circuit 24-k, the inverter IB inverts a write data signal Dk supplied thereto from the CPU 28 and outputs the resultant. The selector SB selects and outputs the output signal of the inverter IB (signal whose value is set opposite to a level value of the write data signal Dk) when a level value of an external input signal Ek supplied thereto via an external pin PAk is "1", whereas the selector SB selects and outputs the write data signal Dk when the level value of the external input signal Ek is "0". A register value of a register R is set to the level value of the output signal of the selector SB in response to the activation of a write request signal Wk supplied thereto from the CPU 28.

When a change of a level value of a control parameter signal Ck is required, the CPU 28 activates the write request signal Wk and sets the level value of the write data signal Dk opposite to the level value of the control parameter signal Ck. For example, if there arises a need to change the level value of the control parameter signal Ck from "1" to "0" in a state where the register value of the register R in the control parameter decision circuit 24-k is "0" and the level value of the external input signal Ek is "1", the CPU 28 activates the write request signal Wk and sets the level value of the write data signal Dk to "0". At this time, in the control parameter decision circuit 24-k, since the output signal of the inverter IB has been selected by the selector SB, the register value of the register R is changed from "0" to "1" in response to the activation of the write request signal Wk. Accordingly, in the control parameter decision circuit 24-k, the level value of the output signal RO of the register R is changed from "0" to "1", and as a result, a level value of an output signal of an inverter IA is changed from "1" to "0". At this time, in the control parameter decision circuit 24-k, since the output signal of the inverter IA has been selected by a selector SA, the level value of the control parameter signal Ck is changed from "1" to "0".

The second embodiment as structured above can also provide the same effects as those of the first embodiment. In addition, in the second embodiment, the control parameter decision circuit 24-k is provided with the inverter IB and the selector SB, thereby eliminating the need for the CPU 28 to recognize the level value of the external input signal Ek when changing the level value of the control parameter signal Ck. As a result, it is possible to simplify the operation of the CPU 28 in setting the level value of the write data signal Dk.

Figure 6:
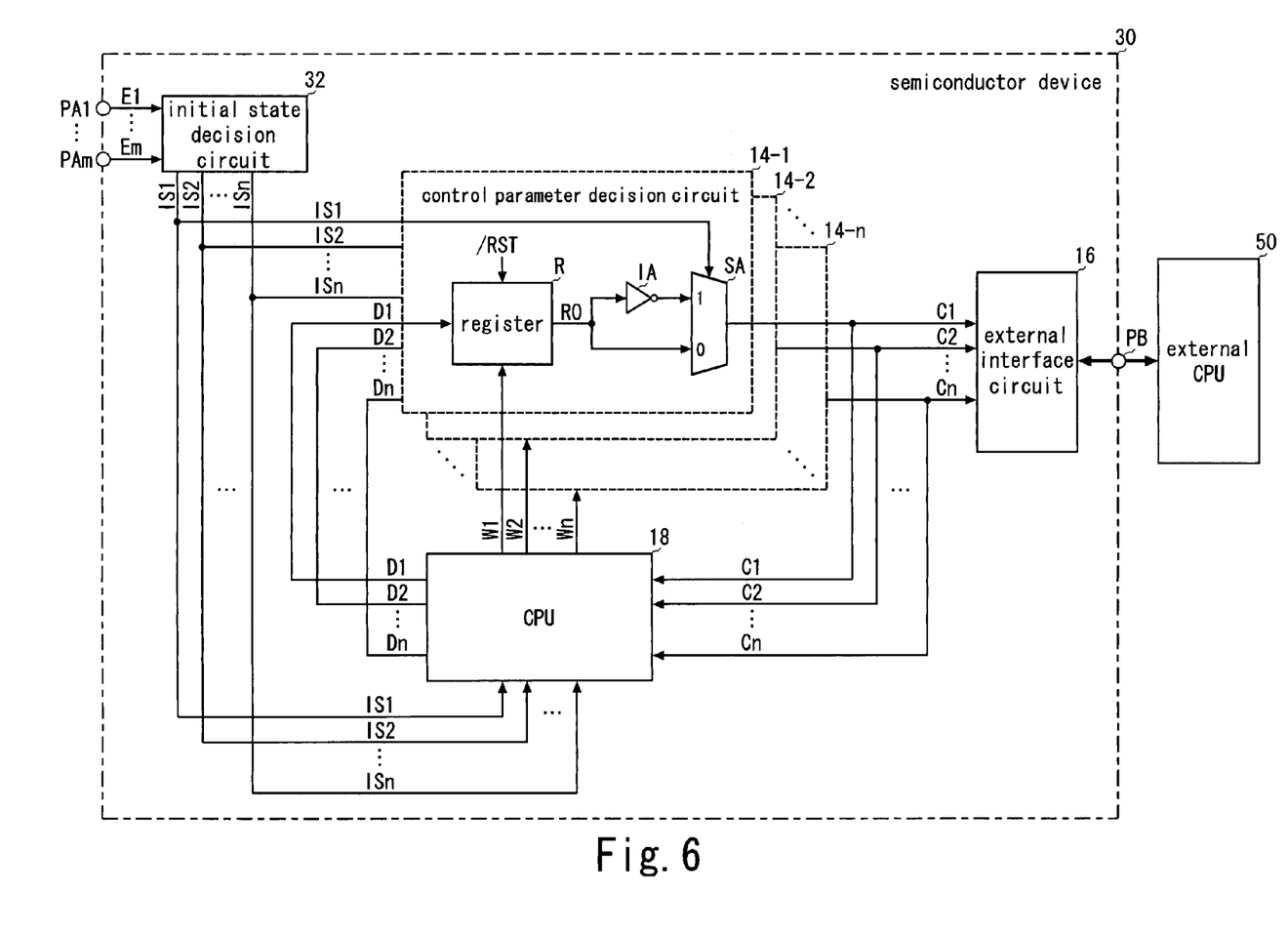
FIG. 6 is a block diagram showing a third embodiment of the present invention.

FIG. 6 shows a third embodiment of the present invention. In the description of the third embodiment (FIG. 6) below, the same reference numerals and symbols are used to designate the same elements as the elements described in the first embodiment (FIG. 3) and detailed description thereof will be omitted. A semiconductor device 30 of the third embodiment is the same as the semiconductor device 10 of the first embodiment except in that the number of external pins PA is m, an initial state decision circuit 32 is provided, and a selector SA in a control parameter decision circuit 14-k (k=1, 2, ..., n) receives an initial state selection signal ISk.

The initial state decision circuit 32 identifies the type of an external CPU 50 externally attached to the semiconductor device 30, based on level values of external input signals E1~Em supplied thereto via the external pins PA1~PAm and decides level values of the initial state selection signals IS1~ISn according to the identification result. For example, when identifying the external CPU 50 as being of a type handling a ready signal RDY as a negative logic signal, the initial state decision circuit 32 sets the level value of the initial state selection signal IS1 to "1". Consequently, as in the first embodiment, a level value of a control parameter signal C1 for designating the logic of the ready signal RDY is set to "1" from an instant immediately after the semiconductor device 30 is reset, and as a result, a level value of the ready signal RDY is set to "1".

The third embodiment as structure above can provide the same effects as those of the first embodiment. Moreover, in the third embodiment, the initial state decision circuit 32 is provided, so that, in a case where the number of the control parameter signals C (n) is larger than the number of the external pins PA (m) necessary for identifying the type of the external CPU 50, it is possible to reduce the number of the external pins PA compared with that in the first embodiment where the external pins PA are provided for the respective control parameter signals C.

Figure 7:
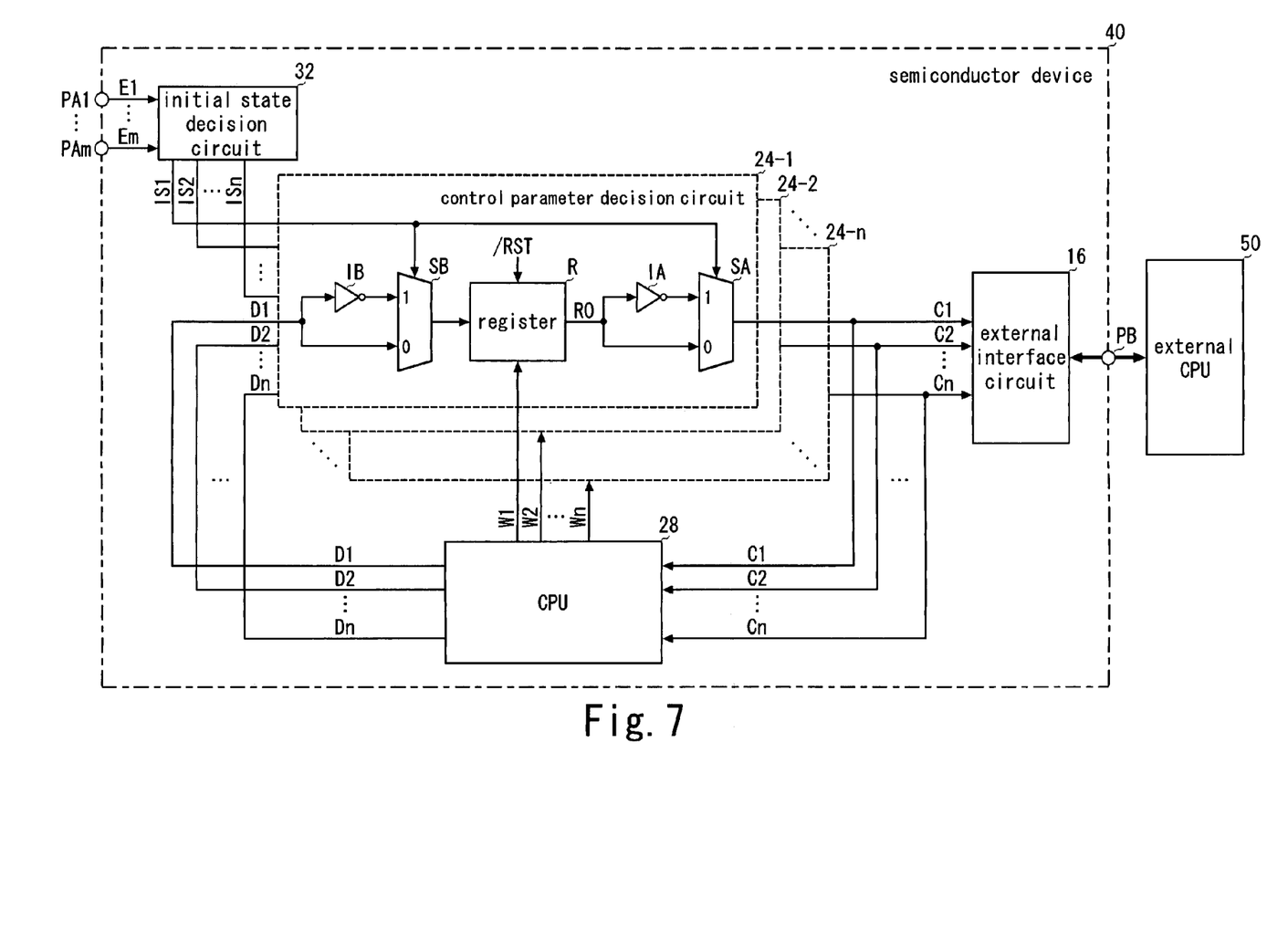
FIG. 7 is a block diagram showing a fourth embodiment of the present invention.

FIG. 7 shows a fourth embodiment of the present invention. In the description of the fourth embodiment (FIG. 7) below, the same reference numerals and symbols are used to designate the same elements as the elements described in the first, second, and third embodiments (FIG. 3, FIG. 5, and FIG. 6), and detailed description thereof will be omitted. A semiconductor device 40 of the fourth embodiment is the same as the semiconductor device 20 of the second embodiment except in that the number of external pins PA is m, an initial state decision circuit 32 is provided, and selectors SA, SB in a control parameter decision circuit 24-k (k=1, 2, ..., n) receive an initial state selection signal ISk. The fourth embodiment as structured above can also provide the same effects as those of the first, second, and third embodiments.

The first to fourth embodiments have described the examples where the control parameter signals C1~Cn are utilized for controlling the external interface circuit 16, but it should be noted the present invention is not limited to these embodiments. For example, at least one of the control parameter signals C1~Cn may be directly utilized for controlling the external CPU 50.

The invention is not limited to the above embodiments and various modifications may be made without departing from the spirit and scope of the invention. Any improvement may be made in part or all of the components.

What is claimed is:

1. A semiconductor device comprising:
   an external pin;
   a control parameter decision circuit including:
      a register that is initialized in accordance with resetting of the semiconductor device;
      an output selector that selects, according to a level value of an external input signal supplied via said external pin, one of a signal whose level value is set equal to a register value of said register and a signal whose level value is set opposite to the register value of said register, and outputs the selected signal as a control parameter signal; and
      a register update circuit that updates the register value of said register when a level value of said control parameter signal need be changed,
   wherein the register value of said register is set to a level value of a write data signal in response to activation of a write request signal, and
   when the level value of said control parameter signal need be changed, the register update circuit activates the write request signal and sets the level value of the write data signal according to the level value of the control parameter signal and the level value of the external input signal.

2. The semiconductor device according to claim 1, further comprising
   an external interface circuit controlling an external device, and
   wherein said control parameter signal is used for controlling said external interface circuit.

3. The semiconductor device according to claim 1, wherein said control parameter signal is used for controlling an external device.

4. A semiconductor device comprising:
   an external pin;
   a control parameter decision circuit including:
      a register that is initialized in accordance with resetting of the semiconductor device;
      an output selector that selects, according to a level value of an external input signal supplied via said external pin, one of a signal whose level value is set equal to a register value of said register and a signal whose level value is set opposite to the register value of said register, and outputs the selected signal as a control parameter signal; and
      a register update circuit that updates the register value of said register when a level value of said control parameter signal need be changed,
   wherein:
      said control parameter decision circuit further includes an input selector that selects, for output, one of a write data signal and a signal whose level value is set opposite to a level value of the write data signal, according to the level value of said external input signal;
      the register value of said register is set to a level value of an output signal of said input selector in response to activation of a write request signal; and
      when the level value of said control parameter signal need be changed, said register update circuit activates said write request signal and sets the level value of said write data signal to a level value opposite to the level value of said control parameter signal.

5. A semiconductor device comprising:
   a plurality of external pins;
   an initial state decision circuit that sets a level value of an initial state selection signal according to level values of a plurality of external input signals supplied via said plural external pins;
   a control parameter decision circuit including:
      a register that is initialized in accordance with resetting of the semiconductor device;
      an output selector that selects, according to the level value of said initial state selection signal, one of a signal whose level value is set equal to a register value of said register and a signal whose level value is set opposite to the register value of said register, and outputs the selected signal as a control parameter signal; and
      a register update circuit that updates the register value of said register when a level value of said control parameter signal need be changed,
   wherein the register value of the register is set to a level value of a write data signal in response to activation of a write request signal; and
   wherein when the level value of the control parameter signal need be changed, the register update circuit activates the write request signal and sets the level value of the write data signal according to the level value of said control parameter signal and the level value of said initial state selection signal.

6. The semiconductor device according to claim 5, wherein:
   said control parameter decision circuit further includes an input selector that selects, for output, one of a write data signal and a signal whose level value is set opposite to a level value of the write data signal, according to the level value of the initial state selection signal;
   the register value of said register is set to a level value of an output signal of said input selector in response to activation of a write request signal; and
   when the level value of said control parameter signal need be changed, said register update circuit activates said write request signal and sets the level value of said write data signal opposite to the level value of said control parameter signal.

7. The semiconductor device according to claim 5, further comprising
   an external interface circuit controlling an external device, and
   wherein said control parameter signal is used for controlling said external interface circuit.

8. The semiconductor device according to claim 5, wherein said control parameter signal is used for controlling an external device.

* * * * *